Aug. 14, 1951

H. F. OLIVER 2,563,953

ANTIBACKLASH MECHANISM

Filed Nov. 22, 1949

INVENTOR.
HERBERT F. OLIVER

BY

Jones and Franklin

ATTORNEYS

Patented Aug. 14, 1951

2,563,953

UNITED STATES PATENT OFFICE 2,563,953

ANTIBACKLASH MECHANISM

Herbert F. Oliver, West Springfield, Mass., assignor to The F. W. Sickles Company, Chicopee, Mass., a corporation of Massachusetts Application November 22, 1949, Serial No. 128,855

11 Claims. (Cl. 74—441)

The present invention relates to a simplified anti-backlash mechanism particularly adapted for employment in radio tuning devices.

It is imperative that the movable tuning elements in a tuning device be accurately positionable in order that radio reception can be as clear and well defined as possible. It therefore is necessary that the operative connection between the tuning control and the movable tuning elements be as positive in nature as possible. Moreover, many radio sets, such as those employed in automobiles, aircraft and the like, are subjected to considerable vibration when in use. Consequently all play between the tuning control and the tuning elements must be eliminated. The presence of such play will not only permit the tuning elements to move when subjected to vibration, thus destroying the sharpness of tuning which is so greatly desired, but will also give rise to inaccurate positioning of the tuning elements when the manually operated knob or other control is manipulated.

It is conventional to employ, for positioning the tuning elements, a rotatable knob operatively connected to the tuning elements by means of gearing. No matter how accurately and precisely such gearing may be constructed there is always some backlash or play inherent therein, and if the knob is to be easily rotated the amount of play must be appreciable. This is particularly the case when the knob rotates a screw-type driving member on which an element operatively connected to the tuning elements is threadedly received.

The construction of a tuning mechanism is affected by economic considerations as well as by mechanical considerations. The simpler the structure of the tuning mechanism may be, the less expensive is the mechanism and hence the more advantageous it is in a competitive market.

The present invention has for its prime object the provision of an extremely simple structure which is easy to manufacture and assemble and which functions as an anti-backlash mechanism particularly adapted for use in radio tuning devices. The invention is characterized by utilizing a minimum number of parts each manufactured in the simplest possible way and easily assemblable to a positively functioning anti-backlash arrangement. By the inclusion of such a mechanism in a tuning device or any other suitable structure, precision in the manufacture of various of the elements may be sacrified at a considerable saving in cost without any consequent sacrifice in accuracy or fidelity of operation.

The invention is here specifically disclosed as an improvement in the tuning mechanism shown in Laschenski Patent 2,478,287 of August 9, 1949, and Whittell Patent 2,252,796 of August 19, 1941. It will be noted that the anti-backlash structure there disclosed comprises two separate pieces, to wit, a helical spring and a pressure plate. It is an important factor in the present invention that the use of these separate elements, individually manufactured of different materials and requiring considerable manipulative skill to assemble, are no longer required, their place being taken, without any sacrifice in function, by a single element easily and cheaply manufactured by a single stamping operation and more readily assemblable with the remainder of the device than was the case with the prior art structures.

It will be understood, of course, that the present invention can be employed in tuning devices other than that disclosed in the Laschenski Patent 2,478,287, and in devices other than tuning devices, where simplicity and inexpensiveness are a factor.

To the accomplishment of the foregoing objects, and such other objects as may hereinafter appear, the present invention relates to an anti-backlash mechanism as defined in the following claims and as described in this specification taken together with the accompanying drawings in which:

Figure 1:
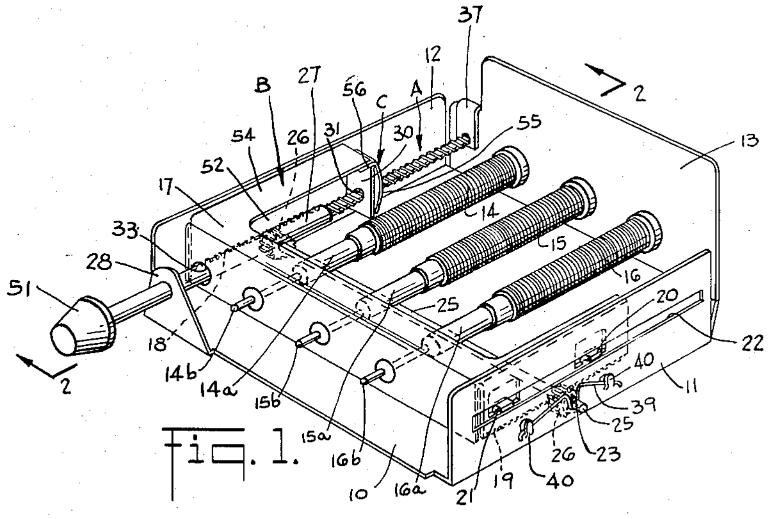
Fig. 1 is a three-quarter perspective view of a tuning device embodying the present invention.

Viewed broadly, the present invention comprises a screw-type driving member generally designated A on which a driven member generally designated B is threadedly received. A one-piece resilient tension member generally designated C is also threadedly received on the driving member A in such a way as to press against the driven member B and constantly resiliently urges it in one direction on the driving member A. Consequently any play in the threaded engagement between the driving member A and the driven member B, which play, if not compensated for, would result in undesirable backlash, is effectively prevented, the driven member B being constantly urged into firm contact with a single continuous screw-type driving surface of the driving member A.

The tuning device in which the anti-backlash mechanism of the present invention is disclosed is of the type shown in Laschenski Patent 2,478,287 and comprises a base plate 10, which plate is provided with a pair of spaced parallel walls 11 and 12. A back wall 13 provides support for the adjustable inductors indicated at 14, 15 and 16. These inductors comprise coil and core assemblies of conventional type, each having associated therewith a core of finely comminuted iron or the like. The cores appear at 14*a*, 15*a* and 16*a* and each carries a mounting rod 14*b*, 15*b*, and 16*b* which extend into threaded engagement with the carriage 17 which constitutes the driven member B.

The carriage 17 is generally U-shaped in plan and each of the leg portions thereof is configured to provide a rack 18 and 19 The right end of the carriage 17 has extending therefrom a pair of lugs or guides 20 and 21 adapted to be received within a slot 22 provided in side wall 11, thus securely positioning that end of the carriage 17 against movements in the vertical sense.

Driving interconnections are provided which are of such a nature that the driving motion imparted to one end portion of the carriage 17 is transmitted to and also applied to the opposite end of said carriage 17. To this end, each of the side walls 11 and 12 is provided with a slot 23 extending transversely of the direction of reciprocatory movements of the carriage 17, and journalled within said slots is a cross rod 25 carrying a pair of pinions 26 which are disposed at opposite ends of said rod. The cross rod 26 is received within the aforesaid slots 23 and maintained in such position by the springs 39 which bear against the under side of cross rod 25 at the region of each end thereof and resiliently react against a pair of lugs 40 struck up from the plane of each of the walls 11 and 12, so that the pinions 26 are disposed to engage the overlying racks 18 and 19 provided upon the carriage 17.

Driving motion is imparted to the carriage through the agency of a rotatable screw-threaded rod 27 which defines the driving member A. It acts as a lead screw for said carriage 17 and further serves to secure the left end of said carriage 17 against displacement movements in the vertical sense. The outer end of said rotatable rod 27 is journalled in an apertured tab 28 extending upwardly from the base plate 10, and its inner end extends through an aperture 29 provided in the rear wall 13. A bifurcated resilient member 37 straddles the rear wall 13 and is provided with an aperture disposed in alignment with aperture 29. The rear leg portion of this member 37 serves as a thrust bearing for the rotatable rod 27, motion of the rod in an outward direction being prevented by a spring clip 38 receivable in a groove formed near the opposite end of the rod 27, thus preventing end play in the rod 27 and contributing to the resultant accuracy of operation of the device.

The left hand leg portion of the U-shaped carriage 17 terminates in a wall 30 provided with a central aperture 31 appropriately shaped to make threaded engagement with the rod 27. The aperture 31 may, if desired, be internally threaded but it has been found feasible merely to punch or otherwise form the aperture 31 in such a shape that it will threadedly engage the rod 27 without having to be tapped. The shape of the punched aperture 31 may be similar to the shape of the aperture 50 in the resilient tension member C which will be described hereafter. The forward portion of the carriage is apertured as at 33 and the rod 27 may be introduced through the aperture 33, after which it is moved inwardly until the threaded portion thereof passes through aperture 31, making threaded engagement therewith, and finally is received within the aperture 29. From the above it will be clear that rotation of the rod 27, as by manipulation of the control knob 51 secured to the end thereof projecting from the apparatus, will result in reciprocatory movement of the carriage 17. The pinions 26 meshing with the racks 18 and 19 will ensure that the carriage 17 will not twist or cant as it is moved, and consequently the tuning cores 14*a*, 15*a* and 16*a* will be accurately moved and positioned The wall 30 of the carriage 17 is preferably formed merely by bending a portion of the sheet metal of which the carriage 17 is composed into a position at right angles to the left side wall 52 thereof. When this is done an aperture 53 is provided between the wall 30 and the top wall 54 of said left hand leg of the carriage 17, as may best be seen in Figs. 2 and 3.

Figures 4, 5:
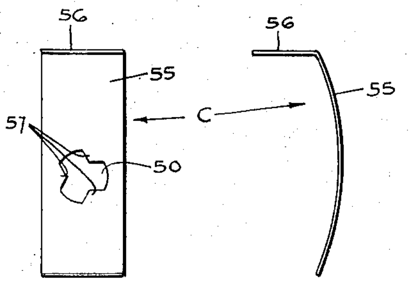
Fig. 4 is a front view of the tension member of the present invention.
Fig. 5 is a side view thereof.

Even if the aperture 31 were internally threaded some play would nevertheless necessarily exist between the carriage 17 and the threaded portion of the rod 27. When the aperture 31 is merely formed by punching, the amount of play is increased. In order to eliminate all backlash arising as a result of this play, the one-piece tension member C shown in Figs. 4 and 5 is employed, this member comprising a body portion 55, preferably bowed as shown best in Fig. 5, and an integral projection 56 extending substantially at right angles thereto. The entire tension member C is formed of some suitable resilient material such as spring steel or phosphor bronze and is preferably formed of sheet material in order to facilitate manufacture. The aperture 50 in the body portion 55 is provided with a plurality of inward projections 57 engageable with the threaded portion of the rod 27 so that rotation of the rod 27 will move the tension member C therealong in the same manner as the carriage 17 is moved.

Figure 2:
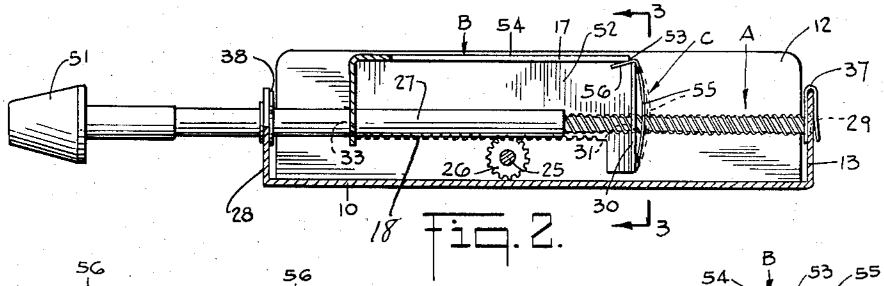
Fig. 2 is a side cross-sectional view thereof taken along the line 2—2 of Fig. 1.
Figure 3:
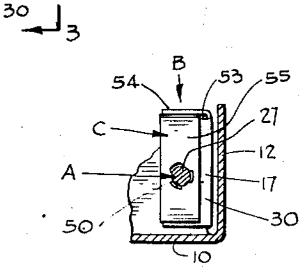
Fig. 3 is an end cross-sectional view taken along the line 3—3 of Fig. 2.

In assembling the apparatus the projection 56 of the tension member C is passed through the aperture 53 between the walls 30 and 54 of the carriage 17. This interlocks the tension member C with the carriage 17 so that the two will be maintained in non-rotative relationship. The body portion 54 is then distorted by being pressed toward the wall 30 of the carriage 17, being moved from its normal dotted line position as shown in Fig. 2 to its distorted solid line position as there illustrated, and the threaded portion of the rod 27 is then engaged with the aperture 50. When in this position the tension member C will constantly and resiliently press against the wall 30 of the carriage 17, both at the top and at the bottom thereof, and thus will constantly urge the carriage 17 to the left as viewed in Figs. 1 and 2 into engagement with the leading surface of the screw-thread on the rod 27, the tension member C itself exerting pressure against the trailing surface of the screw thread. Consequently all backlash or play will be eliminated.

The unitary nature of the tension member constitutes a prime advantage over the prior art. The fact that it can be stamped or cut from sheet material without any wastage, and that its shaping is easily accomplished by standard equipment on a mass production basis, constitutes a prime economic advantage. It is obviously very easily assemblable into the device, and it functions in a positive manner. Through its use the employment of internally threaded apertures engageable with the threaded portion of the rod 17 is made unnecessary and consequently it has a very significant indirect effect in reducing the cost of the overall tuning device.

It will be apparent that many variations may be made in the disclosed structure without departing from the spirit of the invention as defined in the following claims.

I claim:

1. An anti-backlash mechanism comprising a screw-type driving member, a driven member threadedly received thereon, and a one-piece resilient tension member non-rotatably engageable with said driven member and threadedly received on said driving member so as to be distorted in the direction of the axis of said driving member, said tension member constantly resiliently urging said driven member in one direction axially on said driving member.

2. The anti-backlash mechanism of claim 1 in which said tension member comprises a unitary sheet of resilient material maintained in resiliently distorted condition in the direction of the axis of said driving member between said driven member and its own point of threaded engagement with said driving member so as to be distorted in the direction of the axis of said driving member.

3. An anti-backlash mechanism comprising a screw-type driving member, a driven member threadedly received thereon, and a one-piece resilient tension member interlocking with said driven member so as to be non-rotatable with respect thereto and exert pressure thereon, said tension member being threadedly received on said driving member and constantly resiliently urging said driven member in one direction axially on said driving member.

4. The anti-backlash mechanism of claim 3 in which said tension member comprises a unitary sheet of resilient material maintained in resiliently distorted condition in the direction of the axis of said driving member between said driven member and its own point of threaded engagement with said driven member.

5. An anti-backlash mechanism comprising a screw-type driving member, a driven member threadedly received thereon and having an aperture therein, and a one-piece tension member having a projection engageable in said aperture and having a body portion threadedly received on said driving member, said tension member resiliently pressing against said driven member so as to constantly urge said driven member in one direction on said driving member.

6. The anti-backlash mechanism of claim 5 in which said tension member comprises a unitary sheet of resilient material maintained in resiliently distorted condition between said driven member and its own point of threaded engagement with said driving member.

7. In a tuning device comprising a tuning element operatively connected to a movable carriage, and a rotatable screw-type driving member to which said carriage is threadedly connected, the improvement which comprises a separate one-piece resilient tension member threadedly received on said driving member so as to be distorted in the direction of the axis of said driving member and resiliently and non-rotatably engaging said carriage so as to constantly urge said carriage in one direction axially on said driving member.

8. The tuning device of claim 7 in which said tension member comprises a unitary sheet of resilient material maintained in resiliently distorted condition in the direction of the axis of said driving member between said carriage and said driving member.

9. In a tuning device comprising a tuning element operatively connected to a movable carriage, and a rotatable screw-type driving member to which said carriage is threadedly connected, the improvement which comprises a one-piece resilient tension member interlocking with said carriage so as to be non-rotatable with respect thereto, said tension member being threadedly received on said driving member so as to be distorted in the direction of the axis of said driving member and resiliently engaging said carriage so as to constantly urge it in one direction axially on said driving member.

10. The tuning device of claim 9 in which said tension member comprises a unitary sheet of resilient material maintained in resiliently distorted condition in the direction of the axis of said driving member between said driving and driven members.

11. In a tuning device comprising a tuning element operatively connected to a movable carriage, and a rotatable screw-type driving member to which said carriage is threadedly connected, the improvement which comprises said carriage being provided with an aperture, and a one-piece tension member of resilient material having a projection engageable in said aperture and having an apertured body portion, said driving member passing through the aperture in said body portion and making threaded connection with said body portion thereat, said body portion being retained in distorted condition so as to be distorted in the direction of the axis of said driving member and pressing against said carriage so as to constantly urge said carriage in one direction axially on said driving member.

HERBERT F. OLIVER.

REFERENCES CITED

The following references are of record in the file of this patent:

UNITED STATES PATENTS

| Number | Name | Date |
|---|---|---|
| 440,363 | Pearsons | Nov. 11, 1890 |
| 2,478,287 | Laschenski | Aug. 9, 1949 |